United States Patent
Miura

(10) Patent No.: US 6,825,535 B2
(45) Date of Patent: Nov. 30, 2004

(54) FIELD EFFECT TRANSISTOR FORMED ON SOI SUBSTRATE

(75) Inventor: Noriyuki Miura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/284,203

(22) Filed: Oct. 31, 2002

(65) Prior Publication Data

US 2003/0141553 A1 Jul. 31, 2003

(30) Foreign Application Priority Data

Jan. 31, 2002 (JP) ........................................ 2002-023279

(51) Int. Cl.[7] ............................................. H01L 21/265
(52) U.S. Cl. ........................ 257/384; 257/382; 257/388
(58) Field of Search ................................ 257/336, 344, 257/382–385, 388

(56) References Cited

U.S. PATENT DOCUMENTS

| | | | | |
|---|---|---|---|---|
| 4,477,963 A | * | 10/1984 | Cogan | 438/192 |
| 5,192,714 A | * | 3/1993 | Suguro et al. | 438/631 |
| 2002/0056887 A1 | * | 5/2002 | Horstmann et al. | 257/508 |

OTHER PUBLICATIONS

Ben G. Streetman, Solid state Electronic Devices, 4th ed. (1995), p. 354, Prentice–Hall, Inc., Upper Saddle River, New Jersey 07458.*

Lisa T. Su et al., "Optimization of Series Resistance in Sub–0.2 um SOI Mosfets," IEDM Technical Digest, p. 723–726, 1993.

Neal Kistler et al., "Scaling Behavior of Sub–Micron Mosfets on Fully Depleted SOI," Solid–State Electronics vol. 39, No. 4, pp. 445–454, 1996.

Table 4 Applied Physics, vol. 70, No. 9, 2001.

* cited by examiner

*Primary Examiner*—Minhloan Tran
*Assistant Examiner*—Thomas L Dickey
(74) *Attorney, Agent, or Firm*—Volentine Francos, PLLC

(57) ABSTRACT

A field effect transistor comprises a silicon layer formed on an insulator, a diffused layer formed by diffusing dopant from a part of a surface of the silicon layer up to the insulator, a silicide layer formed toward the insulator side from a surface of the diffused layer so as to have a thickness less than or equal to that of the diffused layer, a contact conductive layer formed on the surface of the silicide layer, a gate insulating layer formed on the silicon layer, a gate electrode formed on the gate insulating layer and a sidewall formed on a side surface of the gate electrode. The shortest distance X between surfaces opposed to each other, of the contact conductive layer and the sidewall satisfies a relation represented by the following expression (1):

$$R(slc) \times 10^6 \times (1 + Tslc/Tsoi) \leq X \leq 200/rs. \quad \text{Expression (1)}$$

9 Claims, 5 Drawing Sheets

Source and drain sheet resistance as a function of the thickness of the deposited titanium thickness (100 nm-thick silicon film).

FIELD EFFECT TRANSISTOR FORMED ON SOI SUBSTRATE

BACKGROUND OF THE INVENTION

The present invention relates to a MOS field effect transistor (hereinafter abbreviated as "MOSFET") fabricated on a substrate such as an SOI substrate wherein a silicon thin film is formed on an insulator.

A MOSFET formed on a conventional SOI substrate is formed using a process similar to a process for forming a MOSFET on a normal silicon substrate according to such a process as disclosed in Table 3 of Lisa et al., IEDM Technical Digest, p723–p726, 1993.

In the MOSFET fabricated according to such a manufacturing process, the thickness of an SOI layer is thinned to cope with a so-called short channel effect (SCE) wherein a threshold voltage (Vth) is reduced as a gate length becomes short with micro-fabrication or scale-down of the MOSFET, thereby improving an SCE problem.

A result of an experiment for suppressing the short channel effect by thinning the thickness of the SOI layer of the MOSFET has been shown in FIG. 9 in N. Kistler et al., Solid State Electronics, Vol. 30, No. 4, p445–454 (1996).

Further, a contact resistance is involved in a problem caused by the micro-fabrication of the MOSFET as a point related to a current driving capacity (hereinafter abbreviates as "driving capacity") of the MOSFET. A surface (contact) in which a diffused layer and a contact conductive layer contact with each other, is a window for transferring a signal from the diffused layer to a source or gate electrode via the contact conductive layer. A contact resistance and a diffused layer resistance serve as series parasitic resistances for a channel. Since the components of the contact resistance and diffused layer resistance relatively increase with the scale-down of the MOSFET, a voltage effectively applied across the channel is lowered and hence the driving capacity is reduced.

It is understood that a reduction in contact resistance and the thinning of an SOI layer are needed to prevent the reduction in driving capacity with the scale-down of the MOSFET formed on the substrate having the silicon layer formed on the insulator, like the SOI substrate or the like as described above.

However, when, even if the thinning of the SOI layer and the reduction in the contact resistance are simply made, other factors related to these factors vary and influences the driving capacity, it is very difficult to most effectively prevent the reduction in driving capacity. This is just conceivable where a partial structure related to the driving capacity of the MOSFET is taken into consideration.

The partial structure of the MOSFET is one related to the driving capacity. However, the partial structure is complex in configuration and a plurality of factors are considered to relate to one another as to the determination of the driving capacity. It is therefore conceivable that the simple control of one factor alone could make it difficult to most effectively suppress the reduction in driving capacity.

SUMMARY OF THE INVENTION

The present invention provides a MOSFET capable of thinning an SOI layer and effectively suppressing a reduction in driving capacity thereof due to a contact resistance.

A field effect transistor of the present invention comprises a silicon layer formed on an insulator, a diffused layer formed by diffusing dopant from a part of a surface of the silicon layer up to the insulator, a silicide layer formed toward the insulator side from a surface of the diffused layer so as to have a thickness less than or equal to that of the diffused layer, a contact conductive layer formed on the surface of the silicide layer, a gate insulating layer formed on the silicon layer, a gate electrode formed on the gate insulating layer and a sidewall formed on a side surface of the gate electrode. The shortest distance X between surfaces opposed to each other, of the contact conductive layer and the sidewall satisfies a relation represented by the following expression (1):

$$R(slc) \times 10^6 \times (1+Tslc/Tsoi) \leq X \leq 200/rs. \quad \text{Expression (1)}$$

In the expression (1), X indicates the shortest distance ($\mu$m) between the mutually-opposed surfaces of the contact conductive layer and the sidewall. R(slc) indicates a contact resistance ($\Omega \cdot cm^2$) of a boundary surface between the silicide layer and the diffused layer. Tslc indicates the thickness ($\mu$m) of the silicide layer. Tsoi indicates the thickness ($\mu$m) of the silicon layer and rs indicates a series resistance ($\Omega$/) of the silicide layer.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

The present inventors have considered that there is a need to take into consideration lots of complicatedly-intertwined factors which influence a driving capacity, and comprehensively adjust these factors within a real restricted range to be taken into consideration for the purpose of ensuring the driven force in terms of design of a normal MOSFET, thereby suppressing a reduction in driving capacity.

Therefore, the present inventors have carried out an extensive investigation about a method capable of most effectively preventing a reduction in driving capacity while comprehensively taking into consideration scale down of a MOSFET and a plurality of factors on the assumption that a contact conductive layer resistance is of a level which presents no problem for a driving capacity characteristic, an area (contact area) in which a contact conductive layer and a silicide layer are brought into contact with each other, is constant, the component of the contact resistance makes a less contribution thereto, a diffused layer is sufficiently high in concentration, and the component of a diffused layer resistance makes a less contribution thereto.

As a result, the present inventors have found that such problems as to be listed below are involved in order to suppress the reduction in driving capacity produced when the conventional MOSFET is downsized or scaled down upon design of the MOSFET. Incidentally, a partial structure of a MOSFET, including three factors newly taken into consideration to effectively suppress the reduction in driving capacity in the present invention is shown in FIG. 1 upon description of the following problems.

Figure 1:
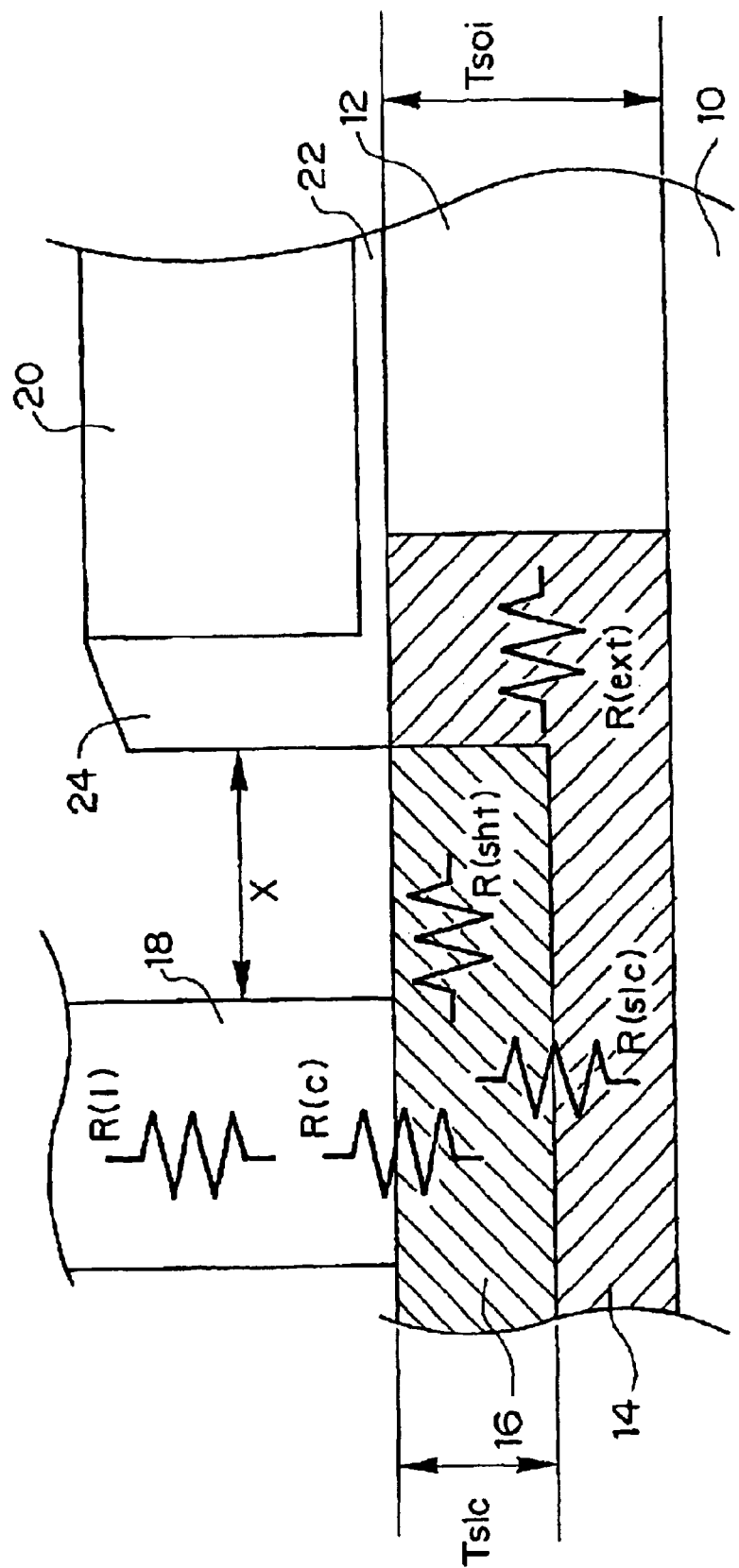
FIG. 1 is a typical cross-sectional view showing a partial structure of a MOSFET according to the present invention.

FIG. 1 is a typical cross-sectional view showing the partial structure of the MOSFET according to the present invention.

The partial structure of the MOSFET shown in FIG. 1 comprises a silicon layer 12 provided on the surface of an insulator 10, a diffused layer 14 formed by diffusing dopant from part of the surface of the silicon layer 12 to the insulator 10, a silicide layer 16 formed toward the insulator 10 side from the surface of the diffused layer 14 so as to have a thickness less than or equal to that of the diffused layer 14, a contact conductive layer 18 provided on the surface of the silicide layer 16, a gate electrode 20 provided over at least the silicon layer 12, a gate insulating layer 22 provided so as to isolate the surface on the insulate 10 side, of the gate electrode 20, and sidewalls 24 (hereinafter might be abbreviated as "SW") each formed of the insulator 10 provided over the diffused layer 14 so as to cover the surface on the contact conductive layer 18 side, of the gate electrode 20.

Incidentally, the contact conductive layer 18 is provided on the surface of the silicide layer 16 to bring a source region or a drain region formed by the diffused layer 14 and the silicide layer 16, and an unillustrated source or drain electrode into conduction.

While the gate electrode 20 is provided over at least the silicon layer 12, the gate electrode 20 is more accurately provided so as to cover the top of the silicon layer 12 provided between at least the diffused layer 14 and an unillustrated diffused layer provided on the side of the silicon layer 12, which is opposite to the diffused layer 14. Further, the gate electrode 20 may be provided so as to slightly cover even the top of the diffused layer 14 and the top of the unillustrated diffused layer as well as the top of the silicon layer 12.

In FIG. 1, R(l) indicates a resistance ($\Omega \cdot cm^2$), R(c) of the contact conductive layer 18, R(c) indicates a contact resistance ($\Omega \cdot cm^2$) of a boundary surface between the silicide layer 16 and the contact layer 18, R(sht) indicates a sheet resistance ($\Omega \cdot \mu m$) of the silicide layer 16, R(ext) indicates a resistance ($\Omega \cdot cm^2$) of the diffused layer 14, and Tsoi indicates the thickness ($\mu m$) of the silicon layer 12, i.e., the thickness of an SOI layer, respectively. Incidentally, the SOI layer means the silicon layer 12, the diffused layer 14 formed by doping the silicon layer 12 with dopant, and the silicide layer 16 formed by silicidizing the diffused layer 14, all of which are shown in FIG. 1.

As newly-considered factors shown in FIG. 1, may be mentioned, R(slc) (hereinafter might be abbreviated as "contact resistance R(slc)" or "R(slc)") indicative of a contact resistance ($\Omega \cdot cm^2$) of a boundary surface between the diffused layer 14 and the silicide layer 16, X (hereinafter might be abbreviated as "contact-SW end interval X" or "X") indicative of the shortest distance (cm) between mutually-opposed surfaces of the contact conductive layer 18 and the sidewall 24, and Tslc (hereinafter might be abbreviated as "silicide layer thickness Tslc" or "Tslc") indicative of the thickness ($\mu m$) of the silicide layer 16. Problems involved where a MOSFET discussed when the present invention is devised, is micro-fabricated, will be described below with reference to FIG. 1.

(Problems Involved Where MOSFET is Scaled Down)

1) Manifestation of a problem about a reduction in driving capacity due to the component of the contact resistance R(slc) of the boundary surface between the diffused layer 14 and the silicide layer 16 with an increase in Tslc/Tsoi ratio As has already been described above, the thinning of the SOI layer, i.e., a reduction in Tsoi shown in FIG. 1 is needed to suppress the occurrence of the short channel effect with the micro-fabrication of the MOSFET.

Figure 6:
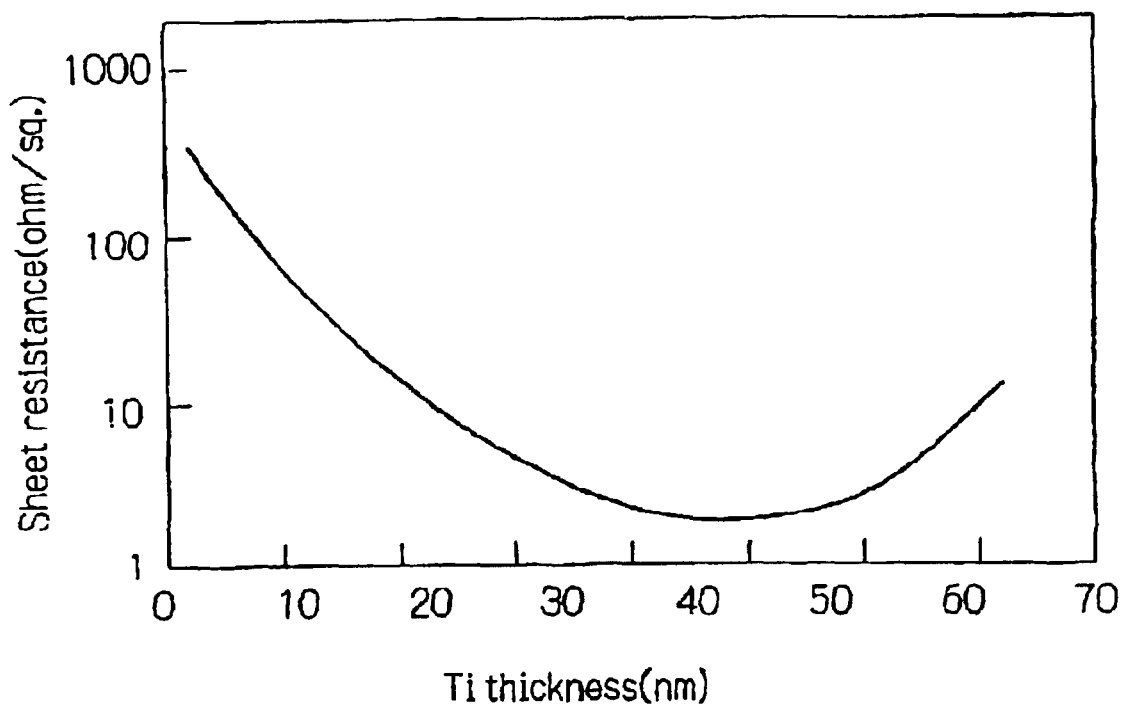
FIG. 6 is a graph illustrating the dependence of a sheet resistance on the thickness of titanium employed in a MOSFET.

On the other hand, the thickness Tslc of the silicide layer 16 cannot be extremely thinned due to a problem about a rise in the sheet resistance R(sht). The reason why Tslc cannot be extremely thinned, can be described with reference to FIG. 6. FIG. 6 is a graph (T. Nishimura et al., SOI Tech. Conference p132 (1989)) showing the dependence of a sheet resistance on the thickness of titanium employed in a MOSFET. The titanium thickness shown in FIG. 6 substantially corresponds to the thickness Tslc of the silicide layer 16 shown in FIG. 1, whereas the sheet resistance shown in FIG. 6 corresponds to the sheet resistance R(sht) shown in FIG. 1. It is understood that as is apparent from FIG. 6, the thickness Tslc of the silicide layer 16 cannot be extremely thinned in terms of a rise in the sheet resistance R(sht).

Since the thickness Tslc of the silicide layer cannot be extremely thinned from the above while it is necessary to reduce the thickness Tsoi of the SOI layer, the ratio between Tslc and Tsoi approaches 1 increasingly.

In this case, a driving capacity characteristic greatly depends on the ratio between Tslc and Tsoi and also greatly depends even on the contact resistance R(slc) of the boundary surface between the silicide layer 16 and the diffused layer 14.

Figure 7:
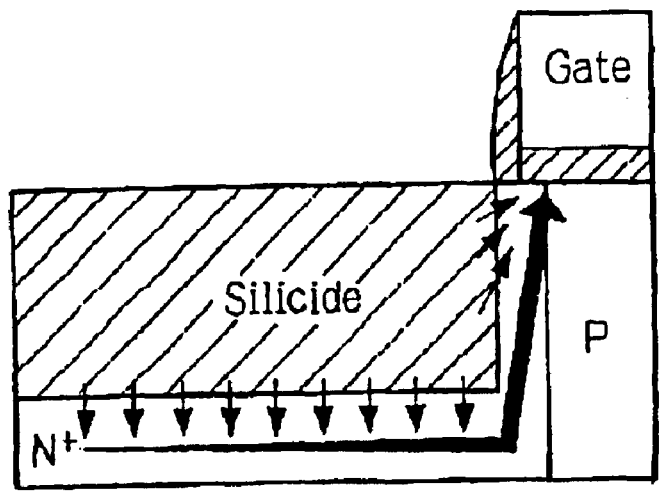
FIG. 7 is a conceptual diagram depicting a current path in the neighborhood of an interface between a silicide layer and a diffused layer of a MOSFET where a Tslc/Tsoi ratio is less than or equal to 1.
Figure 8:
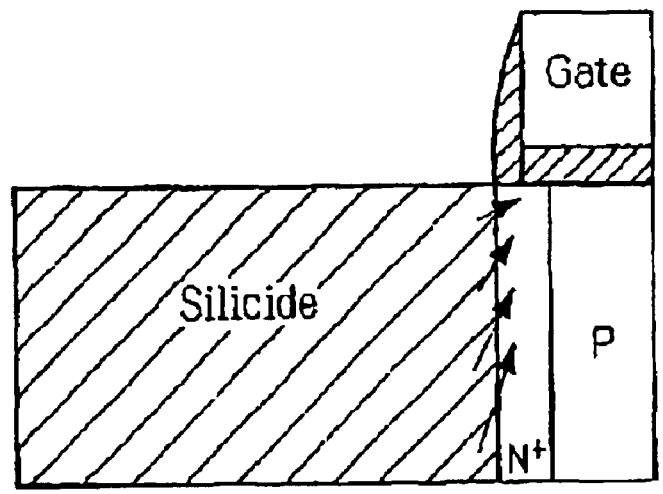
FIG. 8 is a conceptual diagram showing a current path in the neighborhood of an interface between a silicide layer and a diffused layer of a MOSFET where a Tslc/Tsoi ratio is 1.

The reason why the driving capacity characteristic greatly depends on R(slc), can be described with reference to FIGS. 7 and 8. FIG. 7 is a conceptual diagram showing a current path in the neighborhood of a boundary surface between a silicide layer and a diffused layer of a MOSFET where a Tslc/Tsoi ratio is less than 1, and FIG. 8 is a conceptual diagram showing a current path in the neighborhood of the boundary surface between the silicide layer and the diffused layer of the MOSFET where the Tslc/Tsoi ratio is 1 (Jean-pierre Colinge, "Silicon-ON-Insulator technology: Materials to VLSI" (1997) Kluwer Academic Publishers, p116, FIGS. 4. 4. 2). Incidentally, regions indicated by "Silicide" in FIGS. 7 and 8 correspond to the silicide layer 16 shown in FIG. 1, and regions indicated by "N$^+$" correspond to the diffused layer 14 shown in FIG. 1.

Since the area of the contact boundary surface between the Silicide (silicide layer 16 shown in FIG. 1) and the N+ (diffused layer 14 shown in FIG. 1) is large as is understood from FIG. 7, the driving capacity greatly depends on R(slc) when the Tslc/Tsoi ratio is less than or equal to 1. Since the current path at a BOX boundary surface (equivalent to the boundary surface on the insulator 10 side, of the silicide layer 16 in FIG. 1) becomes narrow and the concentration of a current occurs as the Tslc/Tsoi ratio approaches 1 in FIG. 7, a reduction in driving capacity due to R(slc) becomes pronounced. Further, since the area per se in which the silicide layer 6 and the diffused layer 14 are brought into contact, is significantly reduced and R(slc) is inversely proportional to the contact area when the Tslc/Tsoi ratio reaches 1 as shown in FIG. 8, a sharp reduction in driving capacity occurs as compared with FIG. 7.

Figure 2:
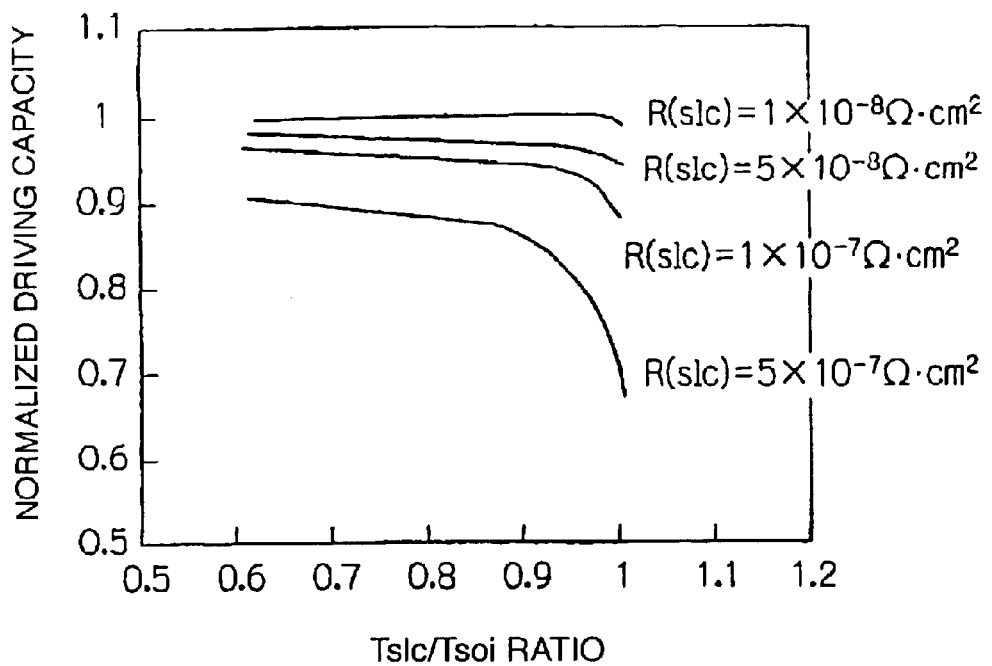
FIG. 2 is a graph showing a result obtained by simulating normalized driving capacities (Normalized Idsat) with respect to Tslc/Tsoi ratios of the MOSFET shown in FIG. 1.

A result obtained by confirming such reductions in driving capacity with increases in Tslc/Tsoi ratio in simulation is illustrated in FIG. 2.

FIG. 2 is a graph showing a result obtained by simulating normalized driving capacities (Normalized Idsat) with respect to Tslc/Tsoi ratios of the MOSFET shown in FIG. 1. In FIG. 2, the horizontal axis indicates a Tslc/Tsoi ratio, and the vertical axis indicates a normalized driving capacity (Normalized Idsat and hereinafter might be abbreviated as "Nid") meaning a driving capacity relatively defined assuming that a drain current flowing when the contact resistance R(slc) is set to 0, is set as 1.

Incidentally, a setting condition used upon execution of the simulation shown in FIG. 2 is as follows: A gate length (corresponding to the length of the gate electrode 20 as viewed in the axial direction of the contact-SW end interval X) of the gate electrode 20 of the MOSFET shown in FIG. 1 was set to 0.15 $\mu$m, the contact-SW end interval X was set to 0.4 $\mu$m, and the width (corresponding to the width of the sidewall as viewed in the axial direction of the contact-SW end interval X) of the sidewall was set to 50 nm.

The area in which the contact conductive layer 18 and the silicide layer 16 contact with each other, was set to a constant area equivalent to 0.126 $\mu m^2$ (however, the diameter of the contact conductive layer 18 was set to 0.2 $\mu$m). The concentration of dopant in the diffused layer 14 was set to a high concentration of $10^{20}$ pcs/cm$^3$. The contributions of R(l), R(c), R(ext) and R(sht) are negligibly very small with respect to the driving capacity characteristic. They were set to levels which may not be taken into consideration absolutely in the simulation shown in FIG. 2.

Under such a setting condition, normalized driving capacities at the time that a gate voltage Vg and a drain voltage Vd were respectively set to 1.5V, were determined where the thickness Tsoi of the SOI layer was set to a constant value of 40 nm and a Tslc/Tsoi ratio was changed. Incidentally, the simulation shown in FIG. 2 has showed a result of driving capacities respectively calculated where the contact resistance R(slc) was capable of taking values of $5 \times 10^{-8}$ ($\Omega \cdot cm^2$), $5 \times 10^{-7}$ ($\Omega \cdot cm^2$) and $5 \times 10^{-6}$ ($\Omega \cdot cm^2$).

As is understood from FIG. 2, the normalized driving capacity decreases as the Tslc/Tsoi ratio approaches 1. Particularly when the Tslc/Tsoi ratio is greater than or equal to 0.9, the normalized driving capacity significantly decreases. It is also understood that the degree of the decrease in driving capacity increases too as the contact resistance R(slc) increases. 2) Manifestation of a problem about a reduction in driving capacity due to the component of the contact resistance R(slc) of the boundary surface between the diffused layer 14 and the silicide layer 16 with the scale-down (micro-fabrication) of the contact-SW end interval X.

There is a potential for the scale-down of the MOSFET to be capable of being achieved by a reduction in the scale of the MOSFET as viewed in its plane direction, like the reduction in the contact-SW end interval X even in addition to a reduction in the scale of the MOSFET as viewed in its thickness direction, like the thinning of such an SOI layer as already described above.

Figure 3:
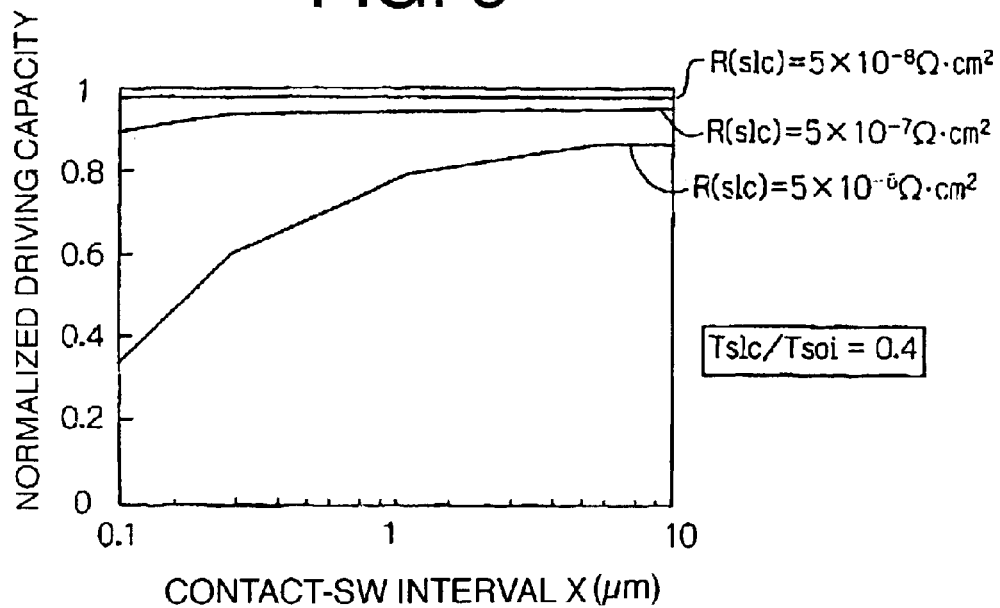
FIG. 3 is a graph illustrating a result obtained by simulating normalized driving capacities (Normalized Idsat) with respect to logarithmic values of contact-sidewall end intervals, of the MOSFET shown in FIG. 1.

FIG. 3 is a graph showing a result obtained by simulating normalized driving capacities with respect to logarithmic values of contact-SW end intervals X, of the MOSFET shown in FIG. 1. In FIG. 3, the horizontal axis indicates a contact-SW end interval X and the vertical axis indicates a normalized driving capacity. Incidentally, a setting condition used upon execution of the simulation shown in FIG. 3 is similar to that for the simulation shown in FIG. 2 except when the contact-SW end interval X is set as an arbitrary value and a Tslc/Tsoi ratio is fixed to 0.4.

Under such a setting condition, normalized driving capacities at the time that a gate voltage Vg and a drain voltage Vd were respectively set to 1.5V, were determined where the contact-SW end interval X was changed. Incidentally, the simulation shown in FIG. 3 has showed a result of driving capacities respectively calculated where the contact resistance R(slc) was able to take values of $1 \times 10^{-8}$ ($\Omega \cdot cm^2$), $5 \times 10^{-8}$ ($\Omega \cdot cm^2$), $1 \times 10^{-7}$ ($\Omega \cdot cm^2$) and $5 \times 10^{-7}$ ($\Omega \cdot cm^2$).

It is understood that as evident from FIG. 3, the normalized driving capacity is reduced with a decrease in the contact-SW end interval X, and the degree of such a reduction becomes pronounced with a rise in the contact resistance R(slc) due to a decrease in the area in which the silicide layer 16 and the diffused layer 14 are brought into contact.

As described above, there has not yet been obtained a design manual for executing the thinning (reduction in Tsoi) of the SOI layer and/or the scale-down (reduction in contact-SW end interval X) of the MOSFET as viewed in its plane direction while suppressing the reduction in the driving capacity in order to cope with the scale-down of the MOSFET.

The present invention provides a field effect transistor having a partial structure comprising a silicon layer provided on the surface of an insulator, a diffused layer formed by diffusing dopant from part of the surface of the silicon layer to the insulator, a silicide layer formed toward the insulator side from the surface of the diffused layer so as to have a thickness less than or equal to that of the diffused layer, a contact conductive layer provided on the surface of the silicide layer, a gate electrode provided over at least the silicon layer, a gate insulating layer provided so as to isolate the surface on the insulate side, of the gate electrode, and sidewalls each formed of the insulator provided over the diffused layer so as to cover the surface on the contact conductive layer side, of the gate electrode, wherein the shortest distance X between the mutually-opposed surfaces of the contact conductive layer and each sidewall satisfies a relation represented by the following expression:

$$R(slc) \times 10^6 \times (1 + Tslc/Tsoi) \leq X \leq 200/rs \qquad \text{Expression (1)}$$

[where in the expression (1), X indicates the shortest distance ($\mu$m) between the mutually-opposed surfaces of the contact conductive layer and the sidewall, R(slc) indicates a contact resistance ($\Omega \cdot cm^2$) of a boundary surface between the silicide layer and the diffused layer, Tslc indicates the thickness ($\mu$m) of the silicide layer, Tsoi indicates the thickness ($\mu$m) of the silicon layer, and rs indicates a series resistance ($\Omega$/) of the silicide layer.]

Described specifically, the field effect transistor of the present invention has such a partial structure as already shown in FIG. 1. In FIG. 1, reference numeral 10 indicates the insulator, reference numeral 12 indicates the silicon layer, reference numeral 14 indicates the diffused layer, reference numeral 16 indicates the silicide layer, reference numeral 18 indicates the contact conductive layer, reference numeral 20 indicates the gate electrode, reference numeral 22 indicates the gate insulating layer, and reference numeral 24 indicates the sidewall, respectively.

Incidentally, if the MOSFET of the present invention is one formed on a substrate wherein a silicon layer is formed on an insulator substrate or a substrate whose surface is covered with an insulating layer, although not restricted in particular, the insulator 10 means a thin film layer comprised of silicon oxide where it is formed on an SOI substrate fabricated by sacrifice-oxidizing the surface of a silicon substrate.

X indicates the shortest distance ($\mu$m) between the mutually-opposed surfaces of the contact conductive layer 18 and the sidewall 24, R(slc) indicates a contact resistance ($\Omega \cdot cm^2$) of a boundary surface between the silicide layer 16 and the diffused layer 14, Tslc indicates the thickness ($\mu$m) of the silicide layer 16, Tsoi indicates the thickness ($\mu$m) of the silicon layer 12, i.e., the thickness of an SOI layer, respectively. rs indicates a series resistance ($\Omega$/) of the silicide layer 16, which is represented by R(sht)/X when R(sht) is set as a sheet resistance ($\Omega \cdot cm^2$) of the silicide layer 16.

Incidentally, while in FIG. 1, R(l) indicates the resistance ($\Omega \cdot cm^2$) of the contact conductive layer 18, R(c) indicates the contact resistance ($\Omega \cdot cm^2$) of the boundary surface between the silicide layer 16 and the contact conductive layer 18, and R(ext) indicates the resistance ($\Omega \cdot cm^2$) of the diffused layer 14, these less contribute to the driving capacity characteristic within the real restricted range to be taken into consideration for the purpose of ensuring the driven force in terms of design of the normal MOSFET. These were handled as those unnecessary to be substantially taken into consideration in the present invention.

Accordingly, the present invention is capable of providing the field effect transistor capable of effectively suppressing the reduction in driving capacity due to the component of the contact resistance R(slc) between the diffused layer 14 and the silicide layer 16 with the thinning of the SOI layer and the reduction in contact-SW end interval X.

While the MOSFET of the present invention has the structure which satisfies the relation given in the expression (1), the reason why the expression (1) is derived, will be described below.

The reason why the term (hereinafter abbreviated as "expression A") of "R(slc)×10$^6$×(1+Tslc/Tsoi)≦X" in the expression (1) is derived by the present inventors, will first be explained.

Figure 4:
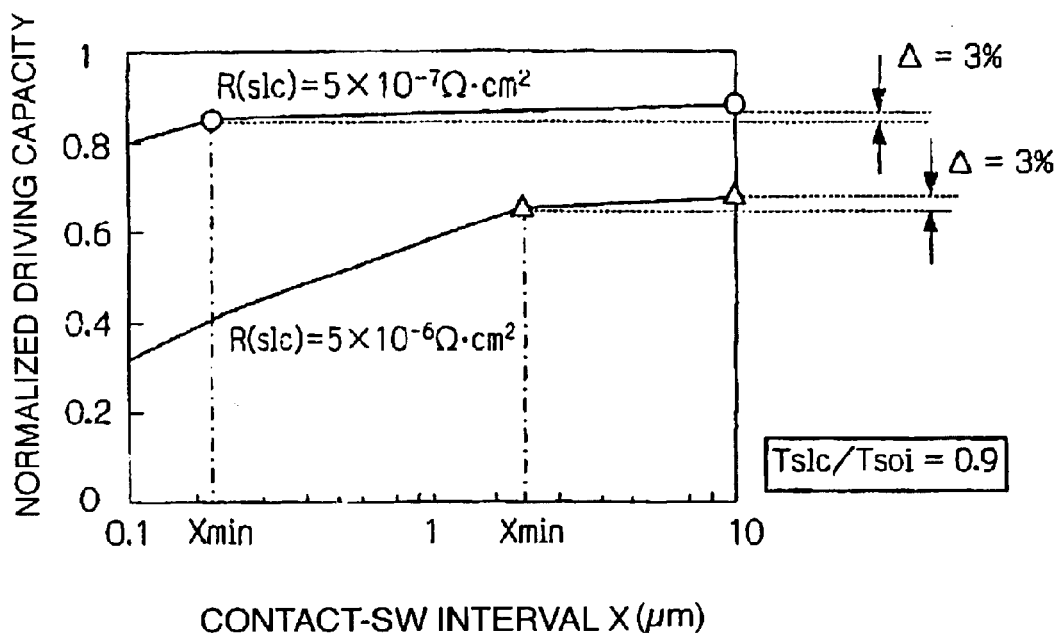
FIG. 4 is a graph depicting a result obtained by simulating normalized driving capacities (Normalized Idsat) with respect to contact-sidewall end intervals X to produce an expression for defining design values of a MOSFET according to the present invention.

Such a graph as shown in FIG. 4 was obtained by simulation similar to FIG. 3 as mentioned previously. FIG. 4 is a graph showing a result obtained by simulating normalized driving capacities with respect to contact-SW end intervals X to produce or derive the expression (A) for defining design values for the MOSFET of the present invention.

The graph shown in FIG. 4 is also one simulated based on the same setting condition as when the result of simulation shown in FIG. 3 is calculated, with the MOSFET shown in FIG. 1 as a premise in a manner similar to FIG. 3. Incidentally, the simulation shown in FIG. 4 has showed a result simulated only where a Tslc/Tsoi ratio was set to 0.9, and a contact resistance R(slc) was set to $5 \times 10^{-7}$ ($\Omega \cdot cm^2$) and $5 \times 10^{-6}$ ($\Omega \cdot cm^2$).

In FIG. 4 obtained as a result of simulation in this way, a contact-SW end interval X at the time that 3% was reduced from a normalized driving capacity at the contact-SW end interval X=10 $\mu$m in which a sufficient driving capacity could be ensured practically from the viewpoint of the scale of the MOSFET, was defined as a lower limit value Xmin ($\mu$m).

Since the area in which he silicide layer 16 and the diffused layer 14 are brought into contact, is sufficiently taken as is understood from FIG. 4 where the contact-SW end interval X is greater than the lower limit value Xmin, a reduction in driving capacity due to the contact resistance R(slc) is small. On the other hand, when the contact-SW end interval X is smaller than the lower limit value Xmin, the driving capacity shows a tendency to abruptly decrease. Further, the lower limit value Xmin greatly depends on the contact resistance R(slc). As the contact resistance R(slc) becomes low, the lower limit value Xmin increases.

Incidentally, the reason why the lower limit value Xmin is defined as described above is that it is difficult to design a MOSFET having a sufficient driving capacity since the normalized driving capacity is abruptly reduced as is understood from FIG. 4 in the case of a contact-SW end interval X in which the driving capacity is reduced 3% or more from the normalized driving capacity at the contact end interval X=10 $\mu$m where the MOSFET is micro-fabricated. In other words, it means that no permission is granted to set the contact-SW end interval X smaller than the lower limit value Xmin from the viewpoint that the practically-required driving capacity is ensured. The contact-SW end interval X and the lower limit value Xmin must satisfy the relation of the following expression (A1).

$$Xmin \leq X \qquad \text{Expression (A1):}$$

Figure 5:
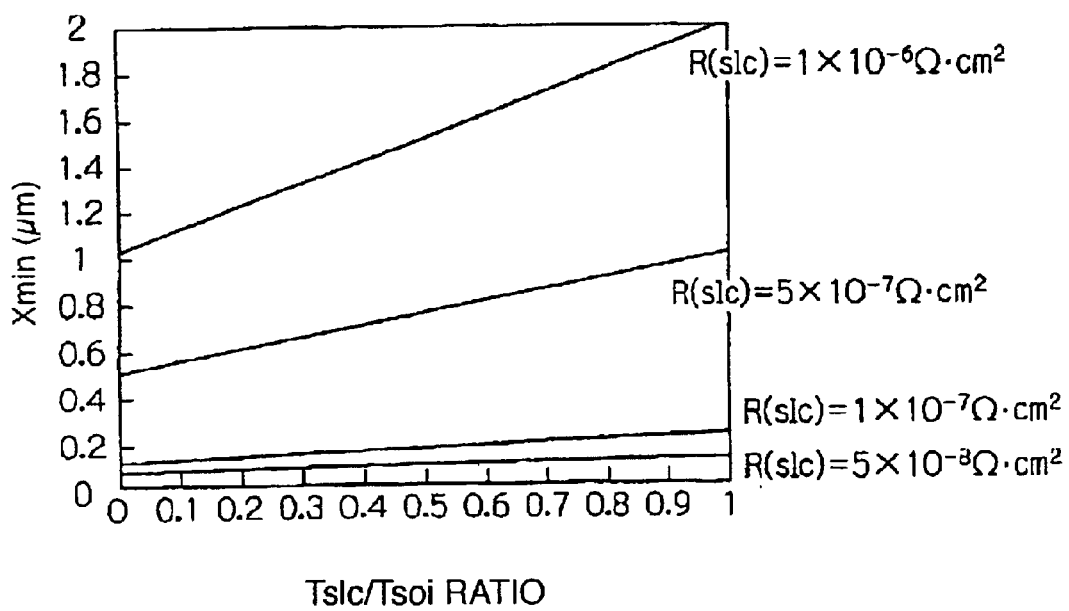
FIG. 5 is a graph showing a result obtained by simulating lower limit values Xmin of a MOSFET according to the present invention with respect to Tslc/Tsoi ratios to define the lower limit values Xmin of the MOSFET.

Next, the lower limit values Xmi obtained as mentioned previously are simulated for Tslc/Tsoi ratios. FIG. 5 is a graph showing a result obtained by simulating the lower limit values Xmin with respect to the Tslc/Tsoi ratios to define the lower limit values Xmin of the MOSFET according to the present invention. FIG. 5 shows a result obtained by calculating the values of respective Xmin for Tslc/Tsoi ratios where R(slc) are set to $1 \times 10^{-6}$ ($\Omega \cdot cm^2$), $5 \times 10^{-7}$ ($\Omega \cdot cm^2$), $1 \times 10^{-7}$ ($\Omega \cdot cm^2$) and $5 \times 10^{-8}$ ($\Omega \cdot cm^2$).

Thus, the lower limit value Xmin ($\mu$m) is represented by the following expression (A2), using the Tslc/Tsoi ratio and the contact resistance R(slc) by reference to FIG. 5.

$$X\text{min} = R(slc) \times 10^6 \times (1 + Tslc/Tsoi) \qquad \text{Expression (A2):}$$

Substituting the expression (A2) in the expression (A1) at this time yields the expression (A).

A description will next be made of the reason why a term (hereinafter abbreviated as "Expression (B)") indicative of "X≦200/rs" in the expression (1), i.e., the maximum value Xmax of the contact-SW end interval X is derived by the present inventors.

The maximum value Xmax is determined as follows from the viewpoint of a voltage loss allowed for the MOSFET.

In the present invention, Xmax has been defined in the following manner on the precondition that an allowable voltage loss ΔVmax is 10% or less, i.e., 120 mV or less in a typical MOSFET wherein a normalized driving capacity Nid is 0.6 mA/$\mu$m and the difference ΔVgs in voltage between gate and source electrodes thereof is 1200 mV.

Firstly, the voltage loss ΔVmax is represented as the following expression (B1) by using the sheet resistance R(sht) and the normalized driving capacity Nid of the silicide layer 16.

$$\Delta V\max \leq R(sht) \times Nid \quad \text{Expression (B1):}$$

On the other hand, the sheet resistance R(sht) of the silicide layer 16 is shown by a relation represented by the contact-SW end interval X (μm) and the series resistance rs (Ω/) of the silicide layer 16, and the following expression (B2).

$$R(sht)=X \times rs \quad \text{Expression (B2):}$$

If the expression (B2) is represented using the maximum value Xmax, it is then given as the following expression (B3).

$$R(sht)=X\max \times rs \quad \text{Expression (B3):}$$

Thus, if the expression (B3) is substituted in the expression (B1), then the maximum value Xmax is represented as the following expression (B4).

$$\Delta V\max/[Nid \times rs] \leq X\max \quad \text{Expression (B4):}$$

Substituting ΔVmax=120 mV and Nid=0.6 mA/μm corresponding to the above precondition in the expression (B4) yields the maximum value Xmax (μm)=200×10$^{-4}$/rs. From this relation, the expression (B) as mentioned previously is derived.

When such expressions (A) and (B) as described above are combined together, the expression (1) for defining the MOSFET of the present invention is obtained.

Thus, if the lower limit value of the contact-SW end interval X is defined as a function of other factors related to the micro-fabrication of the MOSFET, i.e., the contact resistance R(slc), Tslc and Tsoi as shown in the expression (1), a series of these factors related to the reduction in driving capacity with the scale-down of the MOSFET can be optimized in a unified way in consideration of all of them. The more scaled-down MOSFET fabricated based on the expression (1) is capable of most effectively suppressing the reduction in driving capacity.

A description will next be made below of an allowable lower limit value Xmin where a material for the silicide layer 16 is limited to TiSi$_2$, CoSi$_2$ and NiSi, and the diffused layer 14 is formed as an n$^+$ type semiconductor or a p$^+$ type semiconductor.

When the diffused layer 14 is of the n$^+$ type semiconductor and its dopant is given as P, a carrier concentration Nd corresponding to a dissolved or solution limit of P is 2×10$^{20}$ (pcs/cm$^3$) (solution limit of phosphor), whereas when contact resistivity (corresponding to the contact resistance R(slc) in the present invention) obtained experimentally where the silicide layer 16 is composed of TiSi$_2$, is 2.4×10$^{-7}$ (Ω·cm$^2$) (Zaima et al., Applied Physics, Vol. 70, No. 9, p1058).

On the other hand, the left side of the expression (A) indicates the lower limit value Xmin. If R(slc)×10$^6$ is given as a constant C, then the left side is represented as a general expression like the following expression (2).

$$X\min=C \times (1+Tslc/Tsoi) \quad \text{Expression (2):}$$

[Where the Constant C in the Expression (2) Indicates R(slc)×10$^6$]

Accordingly, the constant C in the expression (2) results in 0.24 from the value of the contact resistivity.

Namely, it is desirable that when the silicide layer 16 of the MOSFT of the present invention is composed of TiSi$_2$ and the diffused layer 14 is comprised of the n$^+$ type semiconductor, the lower limit value Xmin of the shortest distance between the surfaces opposed to each other, of the contact conductive layer 18 and each of the sidewalls 24 satisfies the relational expression given by the expression (2), and the constant C in the expression (2) is 0.24.

In a manner similar to the above, desirable set values based on combinations of silicide materials and the types of semiconductors for the diffused layer 14 except that the material for the silicide layer 16 is limited to TiSi$_2$ and the diffused layer 14 is set to the n$^+$ type semiconductor at this time, are respectively as follows:

When the diffused layer 14 is of the p$^+$ type semiconductor and its dopant is B, a carrier concentration Na corresponding to a dissolved or solution limit of B is 1×10$^{20}$ (pcs/cm$^3$) (solution limit of boron), whereas when contact resistivity (corresponding to the contact resistance R(slc) in the present invention) obtained experimentally where the silicide layer 16 is composed of TiSi$_2$, is 2.8×10$^{-7}$ (Ω·cm$^2$) (Zaima et al., Applied Physics, Vol. 70, No. 9, p1058).

Accordingly, the constant C in the expression (2) results in 0.28 from the value of the contact resistivity.

Namely, it is desirable that when the silicide layer 16 of the MOSFT of the present invention is composed of TiSi$_2$ and the diffused layer 14 is formed of the p$^+$ type semiconductor, the lower limit value Xmin of the shortest distance between the surfaces opposed to each other, of the contact conductive layer 18 and each of the sidewalls 24 satisfies the relational expression given by the expression (2), and the constant C in the expression (2) is 0.28.

When the diffused layer 14 is of the n$^+$ type semiconductor and its dopant is given as P, the carrier concentration Nd corresponding to the solution limit of P is 2×10$^{20}$ (pcs/cm$^3$) (solution limit of phosphor), whereas when contact resistivity (corresponding to the contact resistance R(slc) in the present invention) obtained experimentally where the silicide layer 16 is comprised of CoSi$_2$, is 2.0×10$^{-7}$ (Ω·cm$^2$) (Zaima et al., Applied Physics, Vol. 70, No. 9, p1058).

Accordingly, the constant C in the expression (2) results in 0.20 from the value of the contact resistivity.

Namely, it is desirable that when the silicide layer 16 of the MOSFT of the present invention is composed of CoSi$_2$ and the diffused layer 14 is comprised of the n$^+$ type semiconductor, the lower limit value Xmin of the shortest distance between the surfaces opposed to each other, of the contact conductive layer 18 and each of the sidewalls 24 satisfies the relational expression given by the expression (2), and the constant C in the expression (2) is 0.20.

When the diffused layer 14 is of the p$^+$ type semiconductor and its dopant is B, the carrier concentration Na corresponding to the solution limit of B is 1×10$^{20}$ (pcs/cm$^3$) (solution limit of boron), whereas when contact resistivity (corresponding to the contact resistance R(slc) in the present invention) obtained experimentally where the silicide layer 16 is composed of CoSi$_2$, is 5.5×10$^{-7}$ (Ω·cm$^2$) (Zaima et al., Applied Physics, Vol. 70, No. 9, p1058).

Accordingly, the constant C in the expression (2) results in 0.55 from the value of the contact resistivity.

Namely, it is desirable that when the silicide layer 16 of the MOSFT of the present invention is composed of TiSi$_2$ and the diffused layer 14 is comprised of the p$^+$ type semiconductor, the lower limit value Xmin of the shortest distance between the surfaces opposed to each other, of the contact conductive layer 18 and each of the sidewalls 24 satisfies the relational expression given by the expression (2), and the constant C in the expression (2) is 0.55.

When the diffused layer 14 is of the n$^+$ type semiconductor and its dopant is given as P, the carrier concentration Nd corresponding to the solution limit of P is $2\times10^{20}$ (pcs/cm$^3$) (solution limit of phosphor), whereas when contact resistivity (corresponding to the contact resistance R(slc) in the present invention) obtained experimentally where the silicide layer 16 is composed of NiSi, is $4.2\times10^{-8}$ ($\Omega\cdot$cm$^2$) (Zaima et al., Applied Physics, Vol. 70, No. 9, p1058).

Accordingly, the constant C in the expression (2) results in 0.042 from the value of the contact resistivity.

Namely, it is desirable that when the silicide layer 16 of the MOSFT of the present invention is composed of NiSi$_2$ and the diffused layer 14 is comprised of the n$^+$ type semiconductor, the lower limit value Xmin of the shortest distance between the surfaces opposed to each other, of the contact conductive layer 18 and each of the sidewalls 24 satisfies the relational expression given by the expression (2), and the constant C in the expression (2) is 0.042.

When the diffused layer 14 is of the p$^+$ type semiconductor and its dopant is B, the carrier concentration Na corresponding to the solution limit of B is $1\times10^{20}$ (pcs/cm$^3$) (solution limit of boron), whereas when the contact resistivity (corresponding to the contact resistance R(slc) in the present invention) obtained experimentally where the silicide layer 16 is composed of NiSi, is $7.0\times10^{-8}$ ($\Omega\cdot$cm$^2$) (Zaima et al., Applied Physics, Vol. 70, No. 9, p1058).

Accordingly, the constant C in the expression (2) results in 0.070 from the value of the contact resistivity.

Namely, it is desirable that when the silicide layer 16 of the MOSFT of the present invention is composed of NiSi and the diffused layer 14 is comprised of the p$^+$ type semiconductor, the lower limit value Xmin of the shortest distance between the surfaces opposed to each other, of the contact conductive layer 18 and each of the sidewalls 24 satisfies the relational expression given by the expression (2), and the constant C in the expression (2) is 0.070.

According to the present invention as described above, a field effect transistor can be provided which is capable of effectively suppressing a reduction in driving capacity due to the component of a contact resistance R(slc) between a diffused layer and a silicide layer with the thinning of an SOI layer and a reduction in contact-Sw end interval X.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A field effect transistor comprising:
   a silicon layer formed on an insulator;
   a diffused layer formed by diffusing dopant from a part of a surface of the silicon layer up to the insulator;
   a silicide layer composed of CoSi$_2$ and formed toward the insulator side from a surface of the diffused layer so as to have a thickness that is less than or equal to that of the diffused layer;
   a contact conductive layer formed on the surface of the silicide layer;
   a gate insulating layer formed on the silicon layer;
   a gate electrode formed on the gate insulating layer; and
   a sidewall formed on a side surface of the gate electrode;
   wherein the shortest distance X between surfaces opposed to each other, of the contact conductive layer and the sidewall satisfies a relation represented by the following expression (1):

$$R(slc)\times10^6\times(1+Tslc/Tsoi)\leq X\leq 1 \quad \text{Expression (1)}$$

where X indicates the shortest distance ($\mu$m) between the mutually-opposed surfaces of the contact conductive layer and the sidewall, R(slc) indicates a contact resistance ($\Omega$/cm$^2$) of a boundary surface between the silicide layer and the diffused layer, Tslc indicates the thickness ($\mu$m) of the silicide layer, Tsoi indicates the thickness ($\mu$m) of the silicon layer.

2. The field effect transistor according to claim 1, wherein the diffused layer comprises an n$^+$ type semiconductor, a lower limit value Xmin of the shortest distance between the opposed surfaces of the contact conductive layer and the sidewall satisfies a relation represented by the following expression (2), and a constant C in the expression (2) is 0.20;

$$X\text{min}=C\times(1+Tslc/Tsoi) \quad \text{Expression (2)}$$

where Xmin indicates a lower limit value ($\mu$m) of the shortest distance between the opposed surfaces of the contact conductive layer and the sidewall, C indicates a constant, Tslc indicates the thickness ($\mu$m) of the silicide layer, and Tsoi indicates the thickness ($\mu$m) of the silicon layer.

3. The field effect transistor according to claim 1, wherein the diffused layer is comprised of a p$^+$ type semiconductor, the lower limit value Xmin of the shortest distance between the opposed surfaces of the contact conductive layer and the sidewall satisfies a relation represented by the following expression (2), and the constant C in the expression (2) is 0.55;

$$X\text{min}=C\times(1+Tslc/Tsoi) \quad \text{Expression (2)}$$

where Xmin indicates a lower limit value ($\mu$m) of the shortest distance between the opposed surfaces of the contact conductive layer and the sidewall, C indicates a constant, Tslc indicates the thickness ($\mu$m) of the silicide layer, and Tsoi indicates the thickness ($\mu$m) of the silicon layer.

4. A field effect transistor formed on a semiconductor layer having a thickness of Tsoi $\mu$m, the field effect transistor comprising:
   a silicide layer composed of CoSi$_2$ and formed on the semiconductor layer, the silicide layer having a thickness of Tslc $\mu$m;
   a diffusion layer formed in contact with the silicide layer so as to form a boundary surface between the silicide layer and the diffused layer, the boundary surface having a contact resistance of R(slc) ($\Omega$/cm$^2$);
   a contact conductive layer formed on the silicide layer;
   a gate insulating layer formed on the semiconductor layer;
   a gate electrode formed on the gate insulating layer, the gate electrode having a side surface thereof; and
   a sidewall formed on the side surface of the gate electrode, the sidewall and the contact conductive layer having a minimum distance of X $\mu$m, wherein the X satisfies a relation represented by the following expression (1):

$$R(slc)\times10^6\times(1+Tslc/Tsoi)\leq X\leq 1 \quad \text{Expression (1).}$$

5. The field effect transistor according to claim 4, wherein the diffused layer comprises an n$^+$ type semiconductor, the lower limit value of Xmin $\mu$m of the shortest distance between the opposed surfaces of the contact conductive layer and the sidewall satisfies a relation represented by the expression (2), and the constant C in the following expression (2) is 0.20:

$$X\min = C \times (1 + Tslc/Tsoi) \quad \text{Expression (2)}.$$

6. The field effect transistor according to claim 4, wherein the diffused layer is comprised of a p$^+$ type semiconductor, the lower limit value of Xmin μm of the shortest distance between the opposed surfaces of the contact conductive layer and the sidewall satisfies a relation represented by the expression (2), and the constant C in the following expression (2) is 0.55:

$$X\min = C \times (1 + Tslc/Tsoi) \quad \text{Expression (2)}.$$

7. A field effect transistor comprising:
- an SOI substrate having an insulator layer and a semiconductor layer formed on the insulator layer, the semiconductor layer having a thickness of Tsoi μm;
- a silicide layer composed of CoSi$_2$ and formed in the semiconductor layer, the silicide layer having a thickness of Tslc μm;
- a diffusion layer formed in contact with the silicide layer so as to form a boundary surface between the silicide layer and the diffused layer, the boundary surface having a contact resistance of R(slc) (Ω/cm$^2$);
- a contact conductive layer formed on the silicide layer;
- a gate insulating layer formed on the semiconductor layer;
- a gate electrode formed on the gate insulating layer, the gate electrode having a side surface thereof; and
- a sidewall formed on the side surface of the gate electrode, the sidewall and the contact conductive layer having a minimum distance of X μm, wherein the X satisfies a relation represented by the following expression (1):

$$R(slc) \times 10^6 \times (1 + Tslc/Tsoi) \leq X \leq 1 \quad \text{Expression (1)}.$$

8. The field effect transistor according to claim 7, wherein the diffused layer comprises an n$^+$ type semiconductor, the lower limit value of Xmin μm of the shortest distance between the opposed surfaces of the contact conductive layer and the sidewall satisfies a relation represented by the expression (2), and the constant C in the following expression (2) is 0.20:

$$X\min = C \times (1 + Tslc/Tsoi) \quad \text{Expression (2)}.$$

9. The field effect transistor according to claim 7, wherein the diffused layer is comprised of a p$^+$ type semiconductor, the lower limit value of Xmin μm of the shortest distance between the opposed surfaces of the contact conductive layer and the sidewall satisfies a relation represented by the expression (2), and the constant C in the following expression (2) is 0.55:

$$X\min = C \times (1 + Tslc/Tsoi) \quad \text{Expression (2)}.$$

\* \* \* \* \*